United States Patent
Son et al.

(10) Patent No.: US 8,884,935 B2
(45) Date of Patent: Nov. 11, 2014

(54) FLEXIBLE PRINTED CIRCUIT BOARD, BACKLIGHT UNIT USING THE SAME, AND LIQUID CRYSTAL DISPLAY DEVICE COMPRISING THE SAME

(75) Inventors: Ji Eun Son, Paju-si (KR); Kyung Sik Dan, Goyang-si (KR); Se Min Lee, Paju-si (KR); Min Jin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 268 days.

(21) Appl. No.: 12/962,017

(22) Filed: Dec. 7, 2010

(65) Prior Publication Data
US 2011/0134161 A1  Jun. 9, 2011

(30) Foreign Application Priority Data
Dec. 8, 2009 (KR) .................. 10-2009-0121031

(51) Int. Cl.
G09G 5/00 (2006.01)
H05K 1/02 (2006.01)
F21V 8/00 (2006.01)
H05K 1/18 (2006.01)
H05K 3/00 (2006.01)

(52) U.S. Cl.
CPC ............ *G02B 6/0083* (2013.01); *H05K 1/0281* (2013.01); *H05K 2201/10106* (2013.01); *H05K 1/189* (2013.01); *H05K 3/0061* (2013.01); *H05K 1/0207* (2013.01); *H05K 2201/09781* (2013.01); *H05K 2201/09681* (2013.01)
USPC ............................. 345/204; 362/606; 174/257

(58) Field of Classification Search
USPC .................... 345/690, 204; 362/606; 174/257
See application file for complete search history.

(56) References Cited

U.S. PATENT DOCUMENTS

| | | | |
|---|---|---|---|
| 7,867,012 B2 * | 1/2011 | Won | 439/372 |
| 2005/0088830 A1 * | 4/2005 | Yumoto et al. | 361/749 |
| 2007/0126654 A1 * | 6/2007 | Choi et al. | 345/1.1 |
| 2008/0083559 A1 * | 4/2008 | Kusamitsu | 174/254 |
| 2008/0144295 A1 * | 6/2008 | Wang et al. | 361/750 |
| 2009/0002598 A1 * | 1/2009 | Choo et al. | 349/62 |
| 2009/0280672 A1 | 11/2009 | Won | |
| 2010/0128194 A1 * | 5/2010 | Cho et al. | 349/58 |
| 2010/0315835 A1 * | 12/2010 | Cho et al. | 362/612 |

FOREIGN PATENT DOCUMENTS

| | | |
|---|---|---|
| CN | 1598649 A | 3/2005 |
| CN | 101013208 A | 8/2007 |
| JP | 2008117884 A | 5/2008 |
| KR | 1020070057468 A | 7/2009 |
| KR | 1020090117469 A | 11/2009 |

OTHER PUBLICATIONS

Chinese Patent Office Action issued Mar. 5, 2013.
Third Notification of Office Action dated Sep. 5, 2013 from The State Intellectual Property Office of China in counterpart Chinese Application No. 2010-10266948.3.

* cited by examiner

*Primary Examiner* — Jonathan Boyd
(74) *Attorney, Agent, or Firm* — Morgan, Lewis & Bockius LLP

(57) ABSTRACT

A flexible printed circuit board (FPCB) capable of improving strength is disclosed, the FPCB comprising a base film; a copper layer on the base film, the copper layer including a circuit pattern, and a strength-reinforcing pattern in an area without the circuit pattern; and a coverlay film on the copper layer.

8 Claims, 6 Drawing Sheets

FLEXIBLE PRINTED CIRCUIT BOARD, BACKLIGHT UNIT USING THE SAME, AND LIQUID CRYSTAL DISPLAY DEVICE COMPRISING THE SAME

CROSS REFERENCE TO RELATED APPLICATIONS

This application claims the benefit of the Korean Patent Application No. 10-2009-0121031 filed on Dec. 8, 2009, which is hereby incorporated by reference as if fully set forth herein.

BACKGROUND OF THE INVENTION

1. Field of the Invention

The present invention relates to a printed circuit board (PCB), and more particularly, to a flexible printed circuit board (FPCB).

2. Discussion of the Related Art

A printed circuit board (hereinafter, referred to as 'PCB') is used to electrically connect or support electronic components on a blank substrate according a circuit design of electric wiring or traces. The PCB may be largely classified into a rigid PCB (RPCB), a flexible PCB (FPCB), and a special board.

The FPCB allows an efficient arrangement in a limited space of the electronic device, and also enables small-sized and light-weight electronic device. Furthermore, the FPCB is advantages in that it can be designed in various ways. Owing to the aforementioned many advantages, a demand for the FPCB is rapidly increased.

However, when the heavy electronic components are placed on the FPCB, or the large force is applied to the FPCB, the FPCB is apt to be severed due to its low structural strength. In order to overcome this problem of low structural strength, a thick film may be adhered to the related art FPCB so as to enhance the strength of the FPCB. However, the thick film adhered to enhance the strength of the related art FPCB may cause the deterioration of thermal properties. Furthermore, a manufacturing cost is increased due to an additional process for adherence of the thick film.

In case of a backlight unit of an LCD device, light-emitting diodes (hereinafter, referred to as 'LEDs'), which are used as a light source for the backlight unit, are placed onto the PCB. Recently, there is the increased demand for the FPCB in the backlight unit of the LCD device, due to the following disadvantages.

Figure 1A:
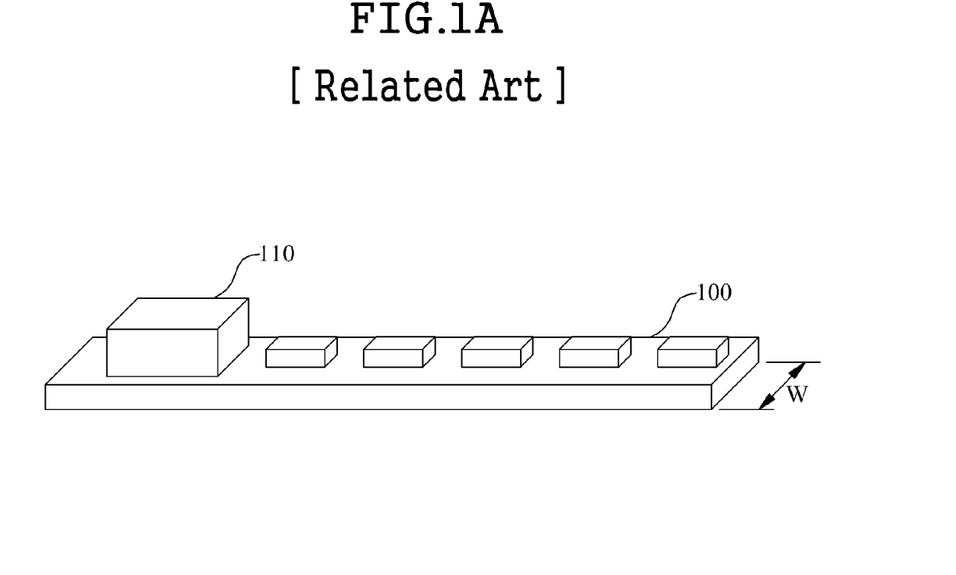
FIG. 1A illustrates a connector and an LED arranged on a metal PCB.

In case of the LCD device using an edge-type backlight unit with LEDs, heat might be concentrated on the PCB on which the LEDs are arranged. In this respect, the PCB is formed of a metal material with great heat-radiation properties. While the metal PCB has the great heat-radiation properties, a width (W) of the metal PCB is inevitably increased due to a connector 110 arranged on the PCB 100, as shown in FIG. 1A. As a result, a thickness of the LCD device is also increased due to the increased width of the metal PCB.

Figure 1B:
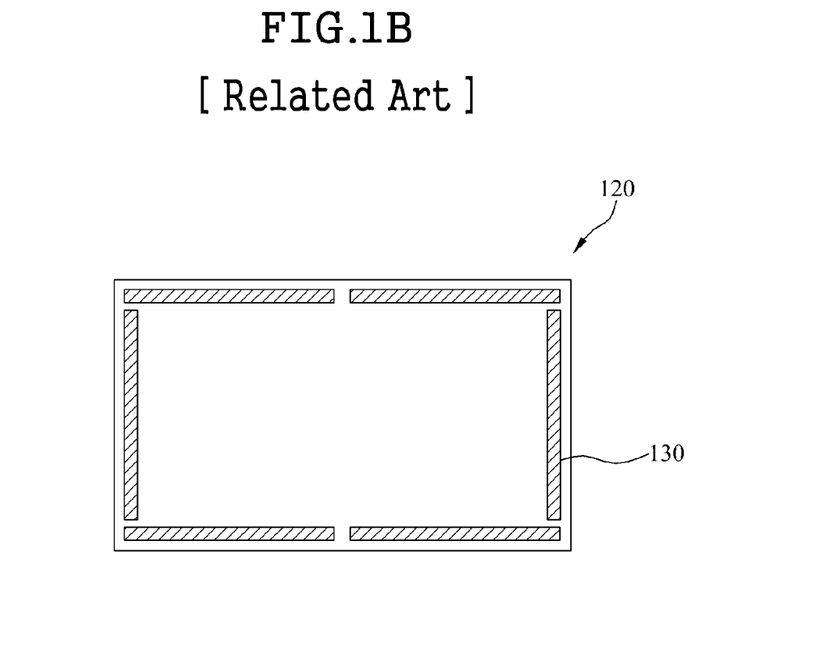
FIG. 1B illustrates heat-radiation areas of LED in a related art LCD device.

For decreasing the thickness of the LCD device, the PCB may be formed of another material instead of the metal material. However, if using the PCB of another material instead of the metal material, as shown in FIG. 1B, heat-radiation areas 130 of LEDs are limited to partial portions of the LCD device 120 using the edge-type backlight unit with LEDs. Thus, heat generated from the LEDs is not smoothly transmitted, whereby efficiency of LEDs may be deteriorated, or the LCD device may be warped or distorted.

SUMMARY OF THE INVENTION

Accordingly, the present invention is directed to a flexible printed circuit board (FPCB) that substantially obviates one or more problems due to limitations and disadvantages of the related art.

An advantage of the present invention is to provide an FPCB with improved strength.

Another advantage of the present invention is to provide a backlight unit which facilitates to realize slimness of LCD device through the use of FPCB, and an LCD device using the backlight unit.

A further advantage of the present invention is to provide a backlight unit which facilitates to improve a thermal conductivity of FPCB, and an LCD device using the backlight unit.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a flexible printed circuit board (FPCB) comprising a base film; a copper layer on the base film, the copper layer including a circuit pattern, and a strength-reinforcing pattern in an area without the circuit pattern; and a coverlay film on the copper layer.

In another aspect of the present invention, there is provided a backlight unit comprising a light-guiding plate with at least one side corresponding to a light-incidence face; a first FPCB confronting the light-incidence face; at least one LED for emitting light to the light-incidence face, the at least one LED positioned on one surface of the first FPCB; a second FPCB connected to an opposite surface to the one surface of the first FPCB; a connector for supplying externally-provided driving power to the at least one LED, the connector positioned on one surface of the second FPCB; and an optical sheet for improving luminance of light advancing from the light-guiding plate.

In another aspect of the present invention, there is provided a liquid crystal panel for displaying images by controlling light transmittance; and a backlight unit for emitting light to the liquid crystal panel, wherein the backlight unit comprises a light-guiding plate with at least one side corresponding to a light-incidence face; a first FPCB confronting the light-incidence face; at least one LED for emitting light to the light-incidence face, the at least one LED positioned on one surface of the first FPCB; a second FPCB connected to an opposite surface to the one surface of the first FPCB; a connector for supplying externally-provided driving power to the at least one LED, the connector positioned on one surface of the second FPCB; and an optical sheet for improving luminance of light advancing from the light-guiding plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 4B to 5B illustrate a structure of FPCB according to one embodiment of the present invention.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a flexible printed circuit board (FPCB) according to the present invention, a backlight unit using the same, and an LCD device comprising the same will be explained with reference to the accompanying drawings.

Figure 2A:
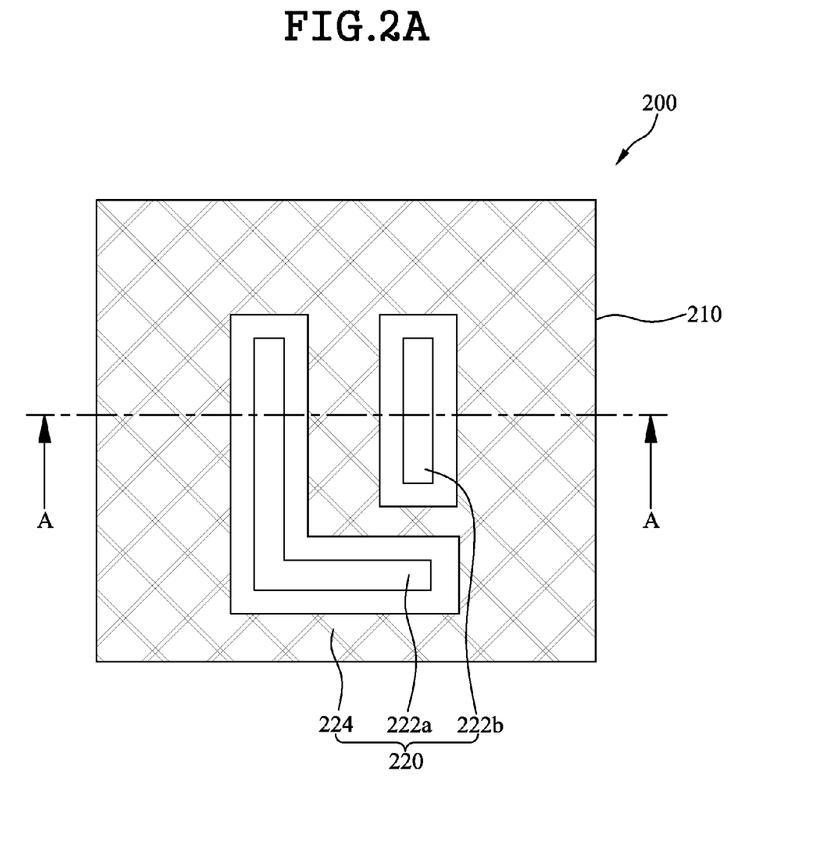
FIG. 2A is a cross section view illustrating a structure of FPCB according to one embodiment of the present invention.

FIG. 2A is a cross section view illustrating an FPCB according to one embodiment of the present invention.

Figure 2B:
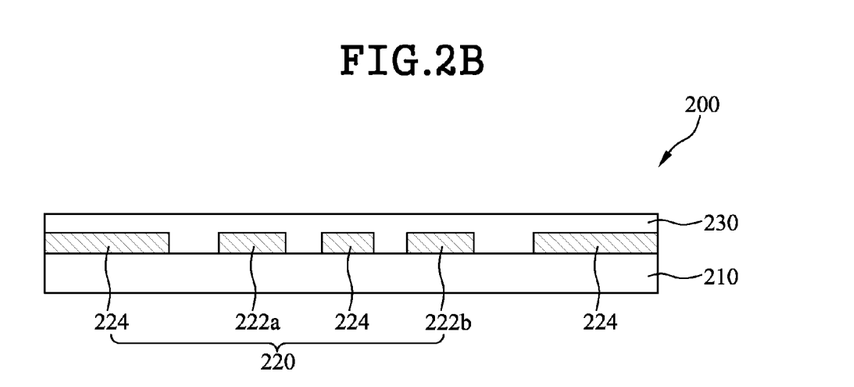
FIG. 2B is a plan view illustrating circuit patterns and strength-reinforcing patterns of copper layer shown in FIG. 2A.

As shown in FIG. 2A and FIG. 2B, the FPCB 200 according to one embodiment of the present invention includes a base film 210; copper layers 220; and a coverlay film 230.

The base film 210 may be formed of polyimide or polyester. The copper layers 220 are formed on the base film 210, wherein the copper layers 220 are formed of copper (Cu). In this case, circuit patterns 222a and 222b are respectively formed in the copper layers 220.

According to one embodiment of the present invention, as shown in FIG. 2A, a strength-reinforcing pattern 224 may be additionally formed in the copper layers 220. The strength-reinforcing pattern 224 is provided to prevent the FPCB 200 from being severed.

As shown in FIG. 2B, the strength-reinforcing pattern 224 is formed in an area without the circuit patterns 222a and 222b, preferably. The strength-reinforcing pattern 224 has no electrical properties on circuit.

Figure 3A:
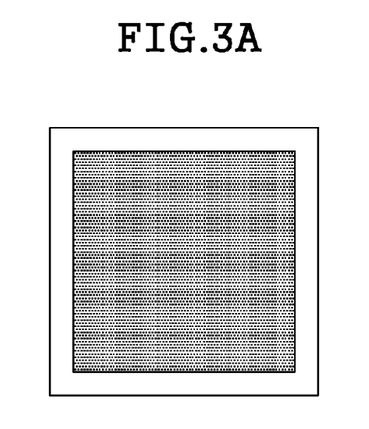
FIGS. 3A to 3C illustrate various exemplary strength-reinforcing patterns.
Figure 3B:
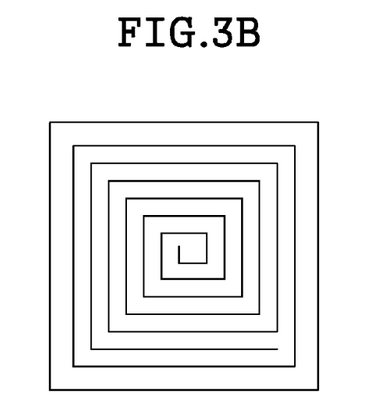
Figure 3C:
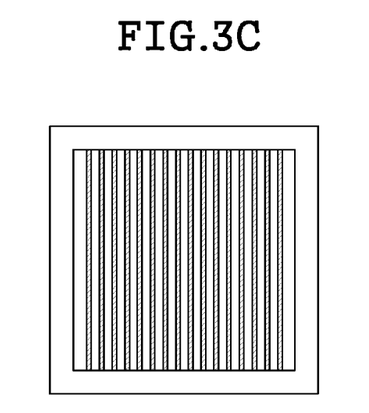

According to one embodiment of the present invention, the strength-reinforcing pattern 224 may be a mesh structure as shown in FIG. 2A; a plate structure as shown in FIG. 3A; a quad spiral structure as shown in FIG. 3B; or a stripe structure as shown in FIG. 3C.

Referring once again to FIG. 2A and FIG. 2B, the coverlay film 230 is formed on the copper layers 220. Like the base film 210, the coverlay film 230 may be formed of polyimide or polyester. The coverlay film 230 performs protection, insulation, and oxidation-prevention functions of the circuit patterns 220 and strength-reinforcing pattern 224 in the copper layers 220.

According to one embodiment of the present invention, the aforementioned FPCB 200 may further include a supporting member (not shown) adhered to a lower surface of the base film 210, wherein the supporting member (not shown) is provided to further enhance the strength of the FPCB 200. The supporting member may be formed of metal such as aluminum (Al), magnesium (Mg), argentums (Ag), or copper (Cu).

In the aforementioned description, it is described that the present invention is applied to the one-sided FPCB, but it is not limited to this type. For example, the present invention is readily applied to both-sided FPCB or multi-layered FPCB.

In case of the both-sided FPCB, the copper layers are formed on the lower surface of the base film as well as on the upper surface of the base film, and the aforementioned strength-reinforcing pattern may be formed in at least any one of the copper layers on the lower and upper surfaces of the base film. In this embodiment of the present invention, the strength-reinforcing pattern is formed in an area without the circuit patterns.

The multi-layered FPCB is formed by depositing the plurality of the aforementioned FPCB shown in FIG. 2A and FIG 2B. Thus, the aforementioned strength-reinforcing pattern may be formed in at least one of the copper layers on the respective base films. In this embodiment of the present invention, the strength-reinforcing pattern is formed in an area without the circuit patterns.

According to one embodiment of the present invention, the strength of FPCB can be enhanced by forming the strength-reinforcing pattern in the copper layers of the FPCB, thereby remarkably reducing the occurrence of severed FPCB without the increase of cost.

Hereinafter, an LCD device using the aforementioned FPCB according to the present invention will be described with reference to the accompanying drawings.

Figure 4A:
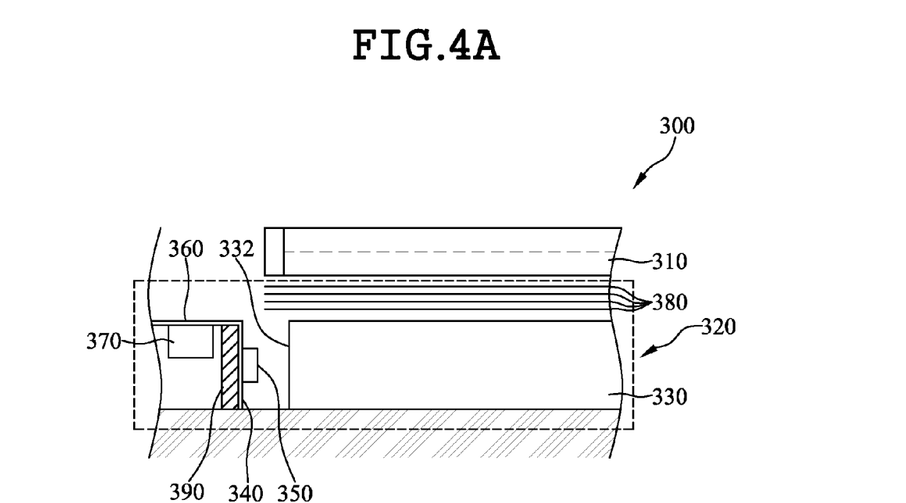
FIG. 4A is a cross section view illustrating a structure of LCD device according to one embodiment of the present invention.

FIG. 4A is a cross section view illustrating the LCD device using the FPCB according to one embodiment of the present invention. As shown in FIG. 4A, the LCD device 300 includes a liquid crystal panel 310 and an edge-type backlight unit 320.

The liquid crystal panel 310 displays desired images by controlling transmittance of light emitted from the edge-type backlight unit 320. For this, the liquid crystal panel 310 includes an upper substrate (not shown) with a upper polarizing plate adhered thereonto, a lower substrate (not shown) with a lower polarizing plate adhered thereonto, and a liquid crystal layer (not shown) between the upper and lower substrates, the liquid crystal layer (not shown) for displaying desired images by controlling light transmittance.

The edge-type backlight unit 320 emits the light toward the liquid crystal panel 310, wherein the edge-type backlight unit 320 includes a light-guiding plate 330, a first FPCB 340, at least one LED 350, a second FPCB 360, a connector 370, and an optical sheet 380.

First, the light-guiding plate 330 guides the light, which is incident through a light-incidence face 332, toward the optical sheet 380. The light-incidence face 332 is poisoned on one side of the light-guiding plate 330. The light-guiding plate 330 includes at least one pattern (not shown) for refracting the incident light several times.

The first FPCB 340 confronts the light-incidence face 332 of the light-guiding plate 330. Also, one or more LEDs 350 are provided at predetermined intervals on one surface of the first FPCB 340.

The LEDs 350 emit the light, and transmit the emitted light to the light-incidence face 332 of the light-guiding plate 330. At this time, the LEDs 350 are packaged on one surface of the first FPCB 340 to confront the light-incidence face 332 of the light-guiding plate 330.

Figure 4B:
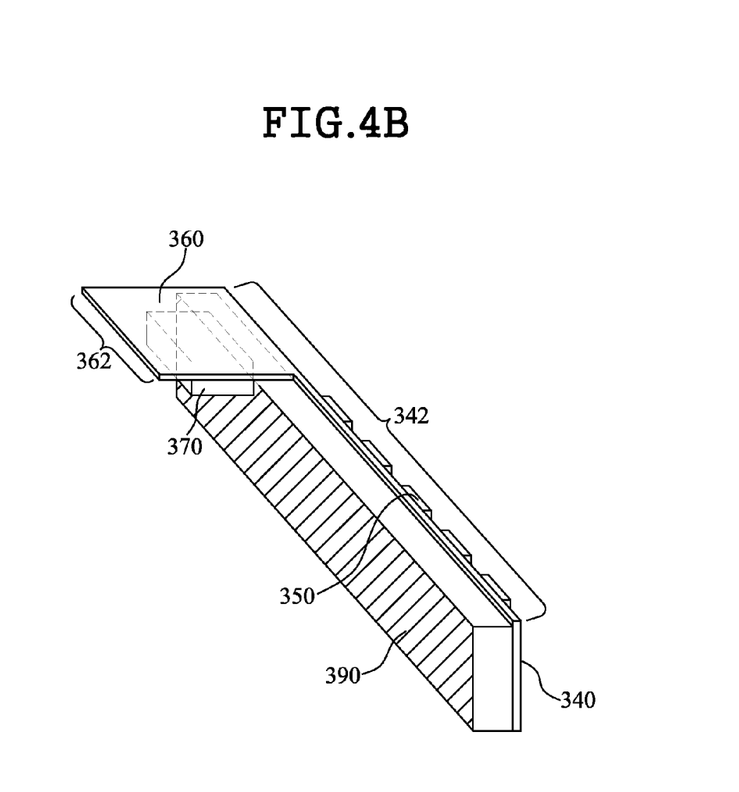

As shown in FIGS. 4A and 4B, the second FPCB 360 is connected to the other surface of the first FPCB 340, wherein the other surface of the first FPCB 340 indicates an opposite surface to one surface with the LEDs 350. Also, the connector 370 is positioned on a one surface of the second FPCB 360.

According to one embodiment of the present invention, a long side 362 of the second FPCB 360 is shorter than a long side 342 of the first FPCB 340. In this case, the second FPCB 360 is connected to partial portion at an upper edge of the other surface of the first FPCB 340, and more particularly, the second FPCB 360 is connected to one end portion at an upper edge of the opposite surface to one surface with the LEDs 350 in the first FPCB 340, as shown FIGS. 4A and 4B.

According to another embodiment of the present invention, the second FPCB 360 may be connected to the other end portion or central portion at an upper edge of the other surface of the first FPCB 340. According to another embodiment of the present invention, the plural second FPCBs 360 may be respectively connected to one end portion, the other end portion and the central portion at an upper edge of the other surface of the first FPCB 340.

Then, the connector 370 supplies externally-provided driving power to the least one LEDs 350 arranged on the first FPCB 340, wherein the connector 370 is positioned on one surface of the second FPCB 360.

According to one embodiment of the present invention, as shown in FIGS. 4A and 4B, the connector 370 may be positioned on the lower surface of the second FPCB 360. In a modified embodiment of the present invention, as shown in FIG. 4C, the connector 370 may be positioned on an upper surface of the second FPCB 360.

Figure 4C:
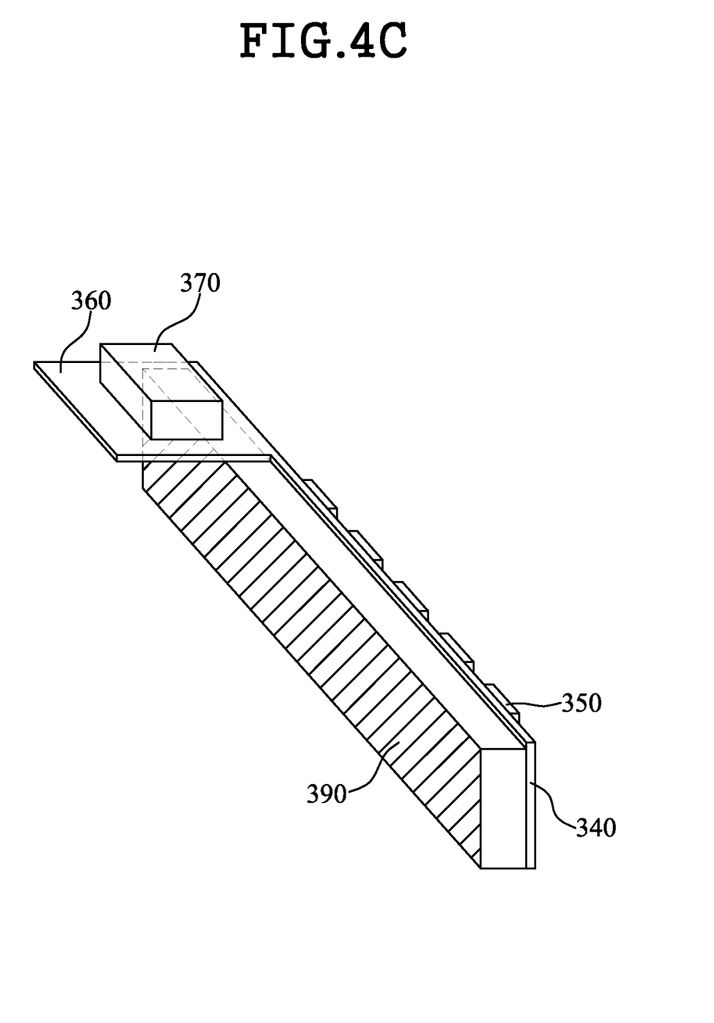

FIGS. 4A to 4C disclose that one connector 370 is positioned on one surface of the second FPCB 360. A modified embodiment of the present invention may disclose that the plural connectors 370 may be positioned on one surface of the second FPCB 360.

The aforementioned embodiment of the preset invention discloses that the second FPCB 360 is connected to the upper edge of the other surface of the first FPCB 340. A modified embodiment of the present invention may disclose that the second FPCB 360 may be connected to a lower edge of the other surface of the first FPCB 340. In this case, the connector 370 is positioned on an upper surface of the second FPCB 360.

Referring once again to FIG. 4A, the optical sheet 380 improves luminance and uniformity of the incident light transmitted from the light-guiding plate 330, and supplies the light with the improved luminance and uniformity to the liquid crystal panel 310. In detail, the optical sheet 380 is provided with at least one diffusion sheet for dispersing the incident light transmitted from the light-guiding plate 330, and uniformly supplying the dispersed light to an image-displaying area of the liquid crystal panel 310 so as to realize uniform luminance of images displayed on the image-displaying area; at least one prism sheet for improving luminance of images displayed on the liquid crystal panel 310 by advancing the incident light transmitted from the diffusion sheet to a predetermined pitch and angle of prism shape; and a protection sheet for protecting the prism sheet.

As shown in FIGS. 4A to 4C, the LCD device 300 according to one embodiment of the present invention may further comprise the supporting member 390 for supporting the first FPCB 340, wherein the supporting member 390 is adhered to the other surface of the first FPCB 340. The supporting member 390 may be formed of a metal material whose thermal conductivity is higher than a predetermined value, for example, aluminum (Al), magnesium (Mg), argentums (Ag), or copper (Cu).

As the supporting member 390 of the metal material is adhered to the other surface of the first FPCB 340, the strength of the first FPCB 340 can be enhanced. Also, since the supporting member 390 is formed of the metal material with the high thermal conductivity, it is possible to improve the heat-radiation properties of the first FPCB 340.

The aforementioned embodiment of the present invention discloses that the supporting member 390 is adhered to the first FPCB 340. A modified embodiment of the present invention may disclose that the supporting member 390 may be adhered to the second FPCB 360 as well as the first FPCB 340. In this embodiment of the present invention, the supporting member 390 may be adhered to the opposite surface to one surface with the connector 370 in the second FPCB 360.

The aforementioned supporting member 390 may have the same size as the first FPCB 340, or may have the size capable of covering the LEDs 350 arranged on the first FPCB 340.

Figure 5A:
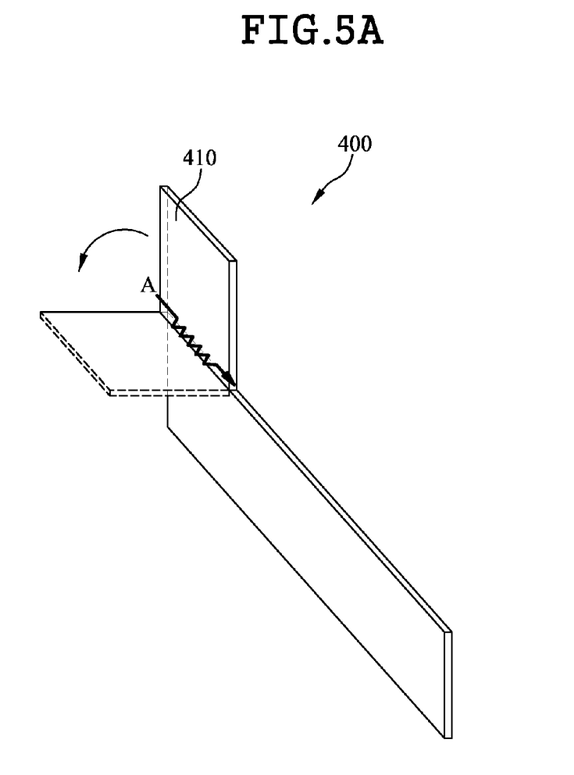

In the aforementioned embodiments of the present invention, the first FPCB 340 and the second FPCB 360 may be formed as one body. In more detail, as shown in FIG. 5A, a FPCB 400 is formed in an 'L' shape which comprises a bar-shaped portion, and an extended part 410 extending from the bar-shaped portion. The extended part 410 is bent in the direction opposite to the light-guiding plate 330 shown in FIG. 4A, to thereby complete the first and second FPCBs 340 and 360 formed as one body.

When the first and second FPCBs 340 and 360 are formed as one body, the extended part 410 may be severed in the bent portion (A) due to the connector 370, as shown in FIG. 5A.

In order to prevent the FPCB 400 from being severed in the bent portion (A) of the extended part 410, the strength-reinforcing pattern 420 may be formed in a first region 430 of the FPCB 400, wherein the first region 430 indicates a region to be applied with the connector's pulling force, that is, region pulled by the connector 370. According to one embodiment of the present invention, the strength-reinforcing pattern 420 may be formed in the copper layer for the FPCB 400, similarly to FIGS. 2A and 2B.

Thus, when the circuit pattern (not shown) is included in the copper layer of the first region 430, the strength-reinforcing pattern 420 is formed in an area without the circuit pattern, preferably.

That is, if the FPCB 400 is the one-sided FPCB, the circuit pattern for arrangement of the LED or connector is formed in the copper layer of the FPCB 400, and the strength-reinforcing pattern 420 is formed in the area without the circuit pattern in the copper layer of the first region 430.

If the FPCB 400 is the both-sided FPCB, the circuit pattern for arrangement of the LED or connector may be formed in any one of the first copper layer on the upper surface of the base film, and the second copper layer on the lower surface of the base film. For example, the circuit pattern for arrangement of the LED or connector may be formed only in the first copper layer.

Figure 5B:
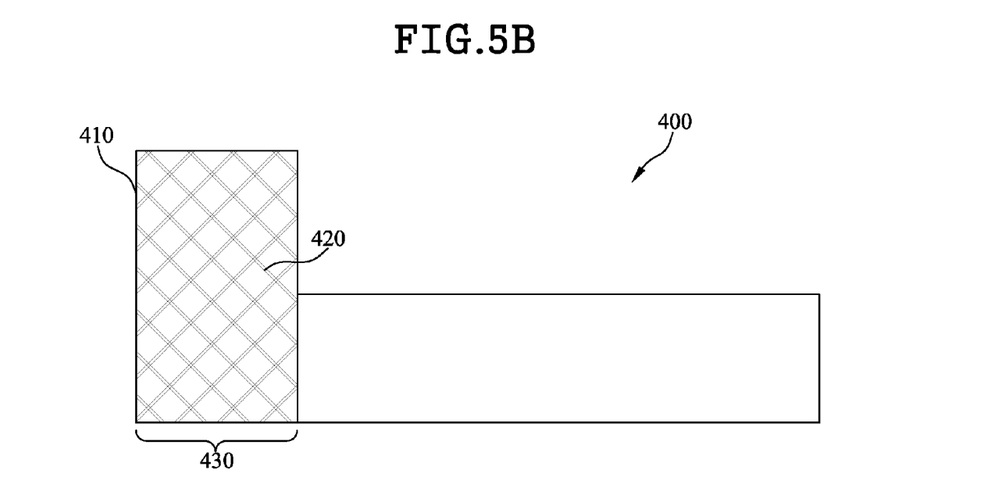

Thus, the strength-reinforcing pattern 420 is formed in the area without the circuit pattern in the first copper layer of the first region 430, and the strength-reinforcing pattern may be formed in the entire area of the second copper layer of the first region 430. FIG. 5B illustrates that the strength-reinforcing pattern is formed in the entire area of the second copper layer of the first region 430.

It is described that the strength-reinforcing pattern 420 is formed only in the copper layer of the first region 430 on the FPCB 400 in FIG. 5B. A modified embodiment of the present invention may disclose that the strength-reinforcing pattern may be formed in the copper layer of the area without the circuit pattern in the entire area of the FPCB 400.

In FIG. 5B, the strength-reinforcing pattern 420 is formed when the first FPCB 340 and the second FPCB 360 are formed as one body. In a modified embodiment of the present invention, the strength-reinforcing pattern may be formed in the copper layer of the first region 430 in the first FPCB 340 and the second FPCB 360, even though the first FPCB 340 and the second FPCB 360 are not formed as one body.

In FIG. 5B, it is illustrated that the strength-reinforcing pattern 420 is mesh structure. However, in a modified embodiment of the present invention, the strength-reinforcing pattern 420 may be the plate structure of FIG. 3A, the quad-spiral structure of FIG. 3B, or the stripe structure of FIG. 3C.

As mentioned above, the strength-reinforcing pattern is formed in the copper layer of the FPCB, whereby the strength of the FPCB can be improved.

Also, the connector 370 is positioned on one surface of the second FPCB 360 connected to the opposite surface to one surface with the LEDs 350 in first FPCB 340 with the LEDs 350, so that it is possible to decrease the width of the FPCB, to thereby result in slimness of the LCD device.

Furthermore, the supporting member 390 is formed of the metal material with the high thermal conductivity, and is adhered to the FPCB, to thereby improve the heat-radiation properties of the FPCB and efficiency of the LEDs, and to prevent the LCD device from being warped or distorted.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backlight unit comprising:
   a light-guiding plate with at least one side corresponding to a light-incidence face;
   a first FPCB confronting the light-incidence face;
   at least one LED for emitting light to the light-incidence face, the at least one LED positioned on one surface of the first FPCB;
   a second FPCB connected to an opposite surface to the one surface of the first FPCB;
   a connector for supplying externally-provided driving power to the at least one LED, the connector positioned on one surface of the second FPCB; and
   an optical sheet for improving luminance of light advancing from the light-guiding plate,
   wherein the second FPCB perpendicularly extends from a long side of the first FPCB and a long side of the second FPCB is shorter than the long side of the first FPCB.

2. The backlight unit according to claim 1, further comprising a supporting member adhered to the opposite surface to the one surface of the first FPCB, wherein the supporting member is formed of a metal material whose thermal conductivity is higher than a predetermined value.

3. The backlight unit according to claim 1, wherein each of the first and second FPCBs comprises:
   a base film;
   a copper layer on the base film, the copper layer including a circuit pattern, and a strength-reinforcing pattern in an area without the circuit pattern; and
   a coverlay film on the copper layer.

4. The backlight unit according to claim 3, wherein the strength-reinforcing pattern is a mesh structure, a plate structure, a stripe structure, or a quad-spiral structure.

5. The backlight unit according to claim 1, wherein the backlight unit includes plural connectors, and the plural connectors are arranged on one surface of the second FPCB.

6. The backlight unit according to claim 1, wherein the second FPCB is formed as one body as the first FPCB, and a long side of the second FPCB is shorter than a long side of the first FPCB.

7. An LCD device comprising:
   a liquid crystal panel for displaying images by controlling light transmittance; and
   a backlight unit for emitting light to the liquid crystal panel, the backlight unit according to claim 1.

8. A backlight unit comprising:
   a light-guiding plate with at least one side corresponding to a light-incidence face;
   a first FPCB confronting the light-incidence face;
   at least one LED for emitting light to the light-incidence face, the at least one LED positioned on one surface of the first FPCB;
   a second FPCB connected to an opposite surface to the one surface of the first FPCB;
   a connector for supplying externally-provided driving power to the at least one LED, the connector positioned on one surface of the second FPCB; and
   an optical sheet for improving luminance of light advancing from the light-guiding plate,
   wherein the second FPCB perpendicularly extends from an upper edge of the first FPCB, wherein the second FPCB is connected to a partial portion of the upper edge of the first FPCB.

* * * * *